(12) United States Patent
Robinett et al.

(10) Patent No.: US 8,773,167 B2
(45) Date of Patent: Jul. 8, 2014

(54) IMPLEMENTING LOGIC CIRCUITS WITH MEMRISTORS

(75) Inventors: Warren Robinett, Chapel Hill, NC (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 176 days.

(21) Appl. No.: 13/561,978

(22) Filed: Jul. 30, 2012

(65) Prior Publication Data

US 2014/0028347 A1    Jan. 30, 2014

(51) Int. Cl.
*H03K 19/00* (2006.01)
*G11C 11/00* (2006.01)

(52) U.S. Cl.
USPC ............... 326/104; 326/38; 326/39; 365/148; 365/189.16

(58) Field of Classification Search
USPC .................. 326/38–39, 104; 365/148, 189.16
See application file for complete search history.

(56) References Cited

U.S. PATENT DOCUMENTS

| | | | | |
|---|---|---|---|---|
| 8,274,312 B2 * | 9/2012 | Pino et al. | | 326/104 |
| 8,305,039 B2 * | 11/2012 | Kadirvel et al. | | 320/132 |
| 8,427,203 B2 * | 4/2013 | Pino et al. | | 326/38 |
| 8,669,785 B2 * | 3/2014 | Pickett | | 326/135 |
| 2011/0049457 A1 | 3/2011 | Kang et al. | | |
| 2011/0181347 A1 * | 7/2011 | Pickett et al. | | 327/538 |
| 2011/0182104 A1 | 7/2011 | Kim et al. | | |
| 2011/0279135 A1 * | 11/2011 | Borghetti et al. | | 324/705 |
| 2013/0100726 A1 * | 4/2013 | Yi et al. | | 365/148 |
| 2013/0311413 A1 * | 11/2013 | Rose et al. | | 706/25 |

FOREIGN PATENT DOCUMENTS

CN        102811051 A    * 12/2012

OTHER PUBLICATIONS

Cong, J. et al., mrFPGA: A Novel FPGA Architecture with Memristor-Based Reconfiguration, (Research Paper), Proceedings of the 2011 IEEE/ACM International Symposium on Nanoscal.
Memristors and Memristive Systems, (Web Page) http://nisl.soe.ucsc.edu/research_Apr2010_memristor.htm.
Wu, J. et al., Memristor Lookup Table (MLUT)-based Asynchronous Nanowire Crossbar Architecture, (Research Paper), 10th IEEE Conference on Nanotechnology (IEEE-NANO), Aug. 17.
Lehtonen, E. et al.; Two memristors suffice to compute all Boolean functions; Feb. 2010; Electronics Letters (46)3.
Lehtonen, E. et al; Stateful implication logic with memrsitors; NANOARCH '09 Proceedings of the 2009 IEEE/ACM International Symposium on Nanoscale Architectures.
Bickerstaff, K. et al., Memristor-based arithmetic, Signals, Systems and Computers (ASILOMAR), 2010 Conference Record of the Forty Fourth Asilomar Conference.

(Continued)

*Primary Examiner* — Vibol Tan

(57) ABSTRACT

Implementing logic with memristors may include circuitry with at least three memristors and a bias resistor in a logic cell. One of the at least three memristors is an output memristor within the logic cell and the other memristors of the at least three memristors are input memristors. Each of the at least three memristors and the bias resistor are electrically connected to voltage sources wherein each voltage applied to each of the at least three memristors and the bias resistor and resistance states of the at least three memristors determine a resistance state of the output memristor.

20 Claims, 12 Drawing Sheets

(56) References Cited

OTHER PUBLICATIONS

Raja, T. et al.; Digital logic implementation in memristor-based crossbars; Communications, Circuits and Systems; 2009. ICCCAS 2009, International Conference on Sep. 2009.

Laiho, M. et al.; Arithmetic operations within memristor-based analog memory; Mar. 2010 12th International Workshop on Cellular Nanoscale Networks and Their Applications (CNNA).

Lehtonen, E. et al; CNN using memristors for neighborhood connections; Mar. 2010 12th International Workshop on Cellular Nanoscale Networks and Their Applications (CNNA).

Laiho, M. et al.; Cellular nanoscale network cell with memristors for local implication logic and synapses; Proceedings of 2010 IEEE International Symposium on Circuits, Date of Conference: May 30-Jun. 2, 2010.

* cited by examiner

IMPLEMENTING LOGIC CIRCUITS WITH MEMRISTORS

BACKGROUND

Memristors are electrical circuit elements that normally work at the nanometer scale. A memristor often exhibits an ability to change its resistance as electrical voltage or current is applied to it. However, once the voltage or current is reduced below a certain magnitude, the memristor's material maintains or "remembers" the resistance change. As a consequence, the memristors may be used to store binary information in memory cells.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Memristors may switch resistance states at lower voltage levels than the signal voltage levels used in transistors based in complementary metal oxide semiconductors (CMOS) technology. Some experimental results suggest that memristors based circuits may employ ten times less voltage when signaling than CMOS circuits. As a result, computing circuits, which traditionally employ many CMOS circuits, may experience a hundred fold energy reduction by implementing memristors to perform the computing circuit's logic if clock speed is held constant.

The principles herein described include devices and circuitry for implementing logic with memristors. For example, implementing logic with memristors may include circuitry with at least three memristors and a bias resistor in a logic cell. One of the memristors is an output memristor within the logic cell and the other memristors are input memristors. Each of the three memristors and the bias resistor may be electrically connected to voltage sources. Each voltage applied to each of the memristors and the bias resistor may determine a resistance state of the output memristor. Thus, the resistance state of the output memristor is a function of the resistance states of the input memristors.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
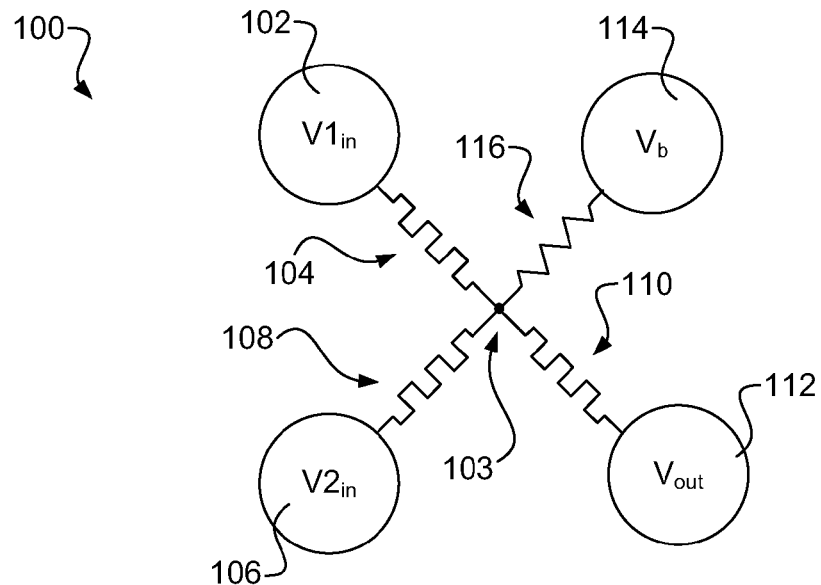
FIG. 1 is a diagram of illustrative circuitry for implementing a 2-input, 1-output logic gate, according to one example of principles described herein.

FIG. 1 is a diagram of illustrative circuitry (100) for implementing a 2-input, 1-output logic gate with memristors, according to principles described herein. In this example, the circuitry (100) has first input voltage source V1in (102) electrically connected to a first input memristor (104). Also, the circuitry (100) in the illustrated example includes a second input voltage source V2in (106) electrically connected to a second input memristor (108). An output memristor (110) is electrically connected to the first and second input memristors (104, 108) and an output voltage source Vout (112) is electrically connected to the output memristor (110). A bias voltage source Vb (114) is electrically connected to a bias resistor (116), which is electrically connected to the memristors (104, 108, 110). The voltage at the central node Vc (103) is influenced by the voltages applied to the bias resistor (116), the input memristors (104, 108), and the output memristor (110). The voltage at the central node Vc (103) is also influenced by the resistances of the bias resistor (116), the input memristors (104, 108), and the output memristor (110). The voltage drop Vc-Vout across the output memristor determines whether or not the state of the output memristor switches. In the illustrated example, each of the voltages applied by the input voltage sources to the input memristors (104, 108) are substantially the same, and is denoted Vin. The voltage drop Vc-Vin across the each input memristor determines whether or not each of the input memristors switches. The circuit is designed such that the output memristor switches under certain conditions, but the input memristors are not intended to switch during a logic operation.

In some examples employing memristors with linear IV curves, the circuitry follows $V_c = (\Sigma(G_i)(V_i))/\Sigma G_i$, where $V_c$ is the voltage of the circuit's central node (103), $G_i$ is the conductances of the memristors (104, 108, 110) and the bias resistor (116), and $V_i$ is a voltage applied to the memristors (102, 106, 112) and the bias resistor (114).

Any of the memristors (104, 108, 110) depicted in FIG. 1 may switch their resistance states with an appropriate voltage. For example, if a voltage drop across a memristor has a first polarity, and the voltage drop is greater than an "on" switching threshold, then the memristor turns "on" (its resistance decreases). Further, if the voltage drop across the memristor has a second opposite polarity, and the voltage drop is below an "off" switch threshold, then the memristor turns "off" (its resistance increases). However, if the voltage drop across the memristor is between on and off switch thresholds, then the memristor's resistance does not change.

To perform logic operations, the time varying voltage sources (102, 106, 112, 114) may be programmed to perform a sequence of write operations using selected memristors. Some of the write operations may be conditional writes, which are write operations that depend on the resistance state of other memristors in the circuit. A conditional write is an operation that involves two or more electrically connected memristors, such as shown in FIG. 1. The circuit is designed such that, depending on the state of the input memristors, the output memristor is either (1) left unchanged in its earlier resistance state or (2) forced to a specific resistance state—that is, forced either to on or to off. When case (1) occurs, the write operation is considered inhibited. When case (2) occurs, the write operation is considered to have taken place. The condition associated with a specific conditional-write operation may be defined as the subset of possible states of the input memristors for which the write operation to the output memristor does take place. The memristors employed are assumed to have two resistance states: a low-resistance stated called "on" or "1," and a high resistance state called "off" or "0". Therefore, for a 2-input circuit, the possible states of the two input memristors is the set {00, 01, 10, 11}. Each of the four elements of this set is called an input vector. An example of a condition is the set C1={01, 10, 11}. This condition could be used to implement the 2-input OR operation provided that the output memristor was first unconditionally written to 0 and provided that the output memristor was then written to 1 if the condition was true. In this example, the final value of the output memristor is 1 if the input vector is in the condition set C1, but the output is 0 if the input vector is not an element of C1. Thus, this operation implements the 2-input OR logic function. Another example of a condition is the set C2={00}. If C1 is replaced with C2 in the above-described operation, the circuit implements the 2-input NOR function, since the input 00 produces the output 1, and the inputs 01, 10, and 11 produce the output 0.

Taking the 2-input NOR function as an example, the way the circuit implementing the example of FIG. 1 functions is as follows. If both of the two input memristors are in the off state and the output memristor has previously been written to the off state, the driving voltages $V_{out}$ (112), $V_b$ (114), and $V_{in}$ (102, 106) are chosen such that the resultant voltage $V_c$ (103) at the central node of the circuit is sufficient to force the output memristor to the on state. More specifically, the voltage drop $DV = V_c - V_{out}$ across the output memristor exceeds the on-switching threshold, and the output memristor switches on. On the other hand, if either or both of the input memristors is on, the circuit is designed such that this increased conductance of the input memristor pulls down the voltage $V_c$ so that the voltage drop $V_c - V_{out}$ across the output memristor is insufficient to cause it to switch. In this case, no write operation occurs, and the write operation is considered inhibited by the increased conductance of the input memristors which were on. This explains the mechanism by which the input 00 (both input memristors in the high resistance state) produces the output 1 (output memristor in the low resistance on state), and the inputs 01, 10, and 11 (one or both the input memristors in a low resistance state) produce the output 0 (output memristor remains in the high resistance state). This mechanism is called a conditional-write operation because the programming of the output memristor (110) is influenced by the resistance states of the input memristors (104, 108), and the execution of a write command to the output memristor is conditioned by the input memristors' resistance states.

The 2-input logic gate circuit of FIG. 1 may be used to implement various 2-input logic functions such as NOR, NAND, OR, and AND. By choosing appropriate values for the resistance of $R_b$ of the bias resistor and choosing the voltages $V_{in}$, $V_{out}$, and $V_b$, the circuit designer may control which of the input vectors (00, 01, 10, 11) will trigger the output memristor to switch. These choices determine which input vectors are members of the condition set. The condition set is equivalent to a truth table which is conventionally used to specify a logic function. In some cases, such as when implementing the XOR logic operation, it may be necessary to use two or more successive conditional-write operations.

Memristors in logic circuitry may have different characteristics than memristors in memory storage, where exhibiting highly non-linear current voltage (IV) curves characteristics is desirable. In some examples with logic circuitry, the memristors may exhibit linear IV curve characteristics. In some examples, the memristor of the illustrated example may have a low switching voltage that may be as low as approximately 0.1 volts. Further, in some examples with logic circuitry, the memristors may have a high endurance, operate at a high speed, and have a moderate on/off ratio.

The memristors may be made to switch at low voltages by making the memristor out of a material that has fairly high ion mobility. Such switching materials may include tantalum (Ta) based materials, silver (Ag) based materials, other materials with high ion mobility, or combinations thereof. In some examples, the memristor's material includes at least one of: niobium, titanium, tungsten, manganese, iron, vanadium, indium, silicon, tantalum, hafnium, nickel, aluminum, zirconium, molybdenum, copper, chromium, silver, oxides thereof, nitrides thereof, carbides thereof, phosphides thereof, sulfides thereof, doped alloys thereof, single element metals, semiconductors, or combinations thereof.

The circuitry may have a high endurance. In some examples, the memristors can have an endurance of about $10^{16}$ cycles or more. The logic gates implemented by the circuitry (100) illustrated in FIG. 1 may operate at high frequencies (e.g. 1 GHz) and may operate reliably for several years.

Further, an on/off ratio for memristors in logic cells may be lower than the on/off ratios for memristors in memory cells. For example, a ratio of 100 may be adequate for memristor implemented logic.

Linear memristors, such as the Ta and Ag based memristors, may be modeled differently than memristors with high non-linearity. A linear memristor which is not in the process of switching may be modeled simply as a conventional linear resistor. Switching of the memristor is modeled as an instantaneous change in resistance (from $R_{off}$ to $R_{on}$, or vice versa) which occurs when the voltage across the memristor exceeds the threshold voltages. The use of this simple sharp-threshold, instantaneous-switching model has been validated using an accurate Simulation Program with Integrated Circuit Emphasis (SPICE) electrical simulation of the logic gate circuit of FIG. 1 employing a SPICE model of Ta based memristors. The SPICE simulation makes predictions about the dynamics of the 2-input NOR gate circuit discussed above, and shows that the circuit works as described, provided the durations of the voltage pulses from the voltage sources Vb, Vout, and Vin are adjusted properly.

The circuitry (100) in the example of FIG. 1 may form a logic cell that may be used to implement multiple logic operations. For examples, the logic cells may be used to execute commutative logic functions. The circuit of FIG. 1 is particularly suitable for implementing commutative logic functions because: (1) the input branches of the circuit are symmetrical (with identical driving voltage Vin, identical topology, and identical type of memristor); (2) the circuit can be said to compute an analog voltage representation at Vc (103) of the weight of the input vector; and (3) this voltage Vc can be used to implement a conditional write operation by controlling the voltage drop across the output memristor as a function of this weight. Logic cells for computing such commutative logic functions with two or more inputs may include NAND gates, AND gates, NOR gates, OR gates, XOR gates, MAJ gates, threshold-logic gates, other gates, or combinations thereof. Multiple logic cells that implement commutative logic functions may be used together to perform non-commutative functions. Thus, logic that uses memristors according to the principles described herein may be used to perform both commutative and non-commutative functions, and thus, any logic function.

Figure 2:
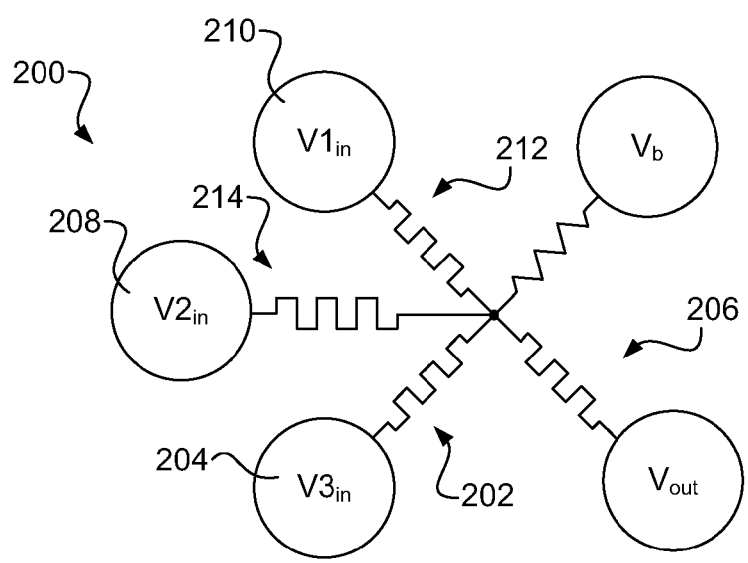
FIG. 2 is a diagram of illustrative circuitry for implementing a 3-input, 1-output logic gate, according to one example of principles described herein.

FIG. 2 is a diagram of illustrative circuitry (200) for implementing logic according to principles described herein. In this example, the circuitry (200) has a third input memristor (202) connected to a third input voltage source (204). The voltage supplied by the third voltage input source (204) may contribute to the overall voltage applied to the output memristor (206) and, as a consequence, may influence whether the output memristor (206) is switched on, is switched off, or is kept at its existing resistance state. Any number of input memristors or bias resistors may be used. In some examples, each of the input voltage sources (204, 208, 210) may pass a current through the input memristors (202, 212, 214) such that the voltage $V_c$ is low enough that the output memristor (206) is not switched on. In some examples, the voltage $V_c$ may be high enough to switch on the output memristor (206). This logic circuit scheme may be used to make logic gates with any number of input memristors.

The following examples depicted in FIGS. 3-14 include specific examples of how the logic cells described above may be used to perform the specific logic functions NOR, NAND, OR, and AND. These figures employ the formula $V_c=(\Sigma(G_i)(V_i))/\Sigma G_i$, for calculating the voltage at Vc (103) from the conductances and voltages in each branch of the circuit, where $V_c$ is the voltage of the circuit's central node (103), $G_i$ is a vector containing the conductances of the memristors (104, 108, 110) and the bias resistor (116), and $V_i$ is a vector containing the voltages applied to the memristors (102, 106, 112) and the bias resistor (114). For example, vector Vi may be defined as follows: V1=Vin; V2=Vin; V3=Vb; V4=Vout. Vector Gi may be defined as follows: G1=the conductance of the first input memristor; G2=the conductance of the second input memristor; G3=the conductance of the bias resistor; and G4=the conductance of the output memristor. In these examples, the on-resistance of the memristors is assumed to be 1 kΩ, and the off-resistance of the memristors is assumed to be 100 kΩ. From these values, the voltage drop Vc-Vout across the output memristor and the voltage drop Vc-Vin across the input memristors can be calculated. Note that the term "voltage" is usually used to refer to the potential at a node in a circuit, with reference to an arbitrarily chosen node of the circuit called ground. However, it is the "voltage drop" across a memristor (a difference between the potentials of its two terminals), which determines whether or not a memristor switches. This distinction between absolute voltages in the circuit (representing potentials) and voltage drops (representing differences of potential) is significant in understanding the switching operations of the memristors.

The input voltage sources (204, 208, 210) may be variable voltage sources that may be used to provide voltage pulses. In this example, each of the input voltage sources (204, 208, 210) may apply different voltage values. For example, the voltage from the first input voltage source (210) may be greater or less than the voltage applied with the second input voltage source (208). Further, the voltage levels from each of the input voltage sources (204, 208, 210) may vary at different times. Further, the impedance of each of the input voltage sources (204, 208, 210) may also vary. Thus, the voltage inputs applied to each of the input memristors (204, 208, 210) may be different for each phase of a logic operation.

Figures 3, 4:
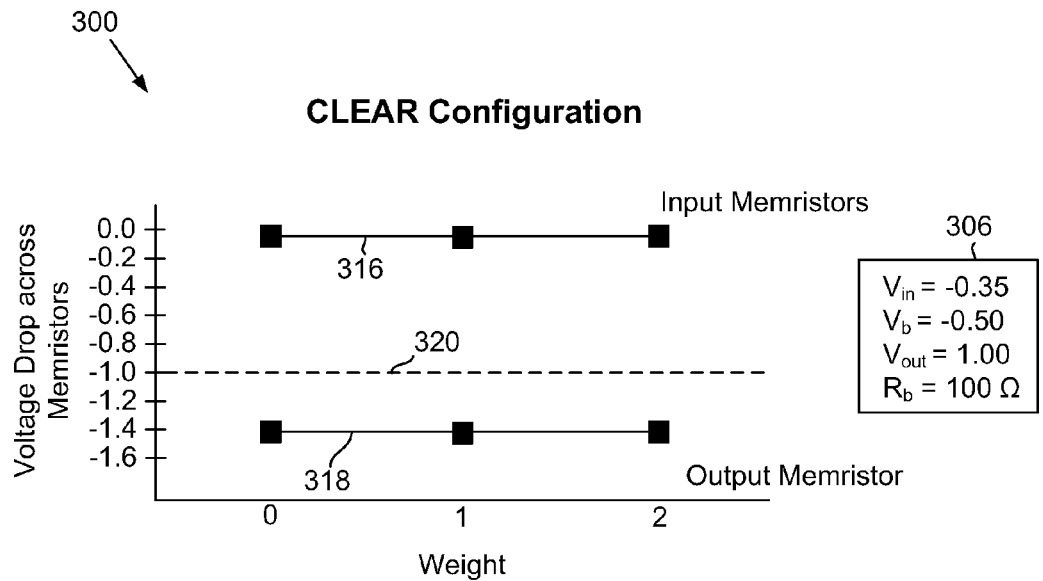
FIG. 3 is a diagram of an illustrative chart for a CLEAR operation schematically representing voltage drops across input and output memristors versus the weight of the input vector, according to one example of principles described herein.
FIG. 4 is a diagram of an illustrative weight table for the CLEAR operation summarizing the behavior of the circuit for each weight, according to one example of principles described herein.

Each of the logic functions includes two phases. The first phase is a clearing phase, where the output memristor is switched to an off resistance state or other predetermined resistance state (FIGS. 3 and 4). Various second phase examples are depicted in FIGS. 5-14. For the purposes of explanation, the off switch threshold for each of the below examples is −1.00 volt and the on switch threshold is 1.00 volt. These voltages are only one example. A variety of other voltages could be used. For example, the switching threshold may be between 1 volt and 0.1 volt. Also, the bias resistance is adjusted as indicated in each of the examples. To accommodate the resistance changes the resistor providing the bias resistance may be adjustable from phase to phase. Alternatively, a circuit which acts as a variable resistance may replace the bias resistor. Further, the end result of each of the logic functions is to cause the output memristor to change its resistance state (write a "1" in binary code) or to prevent the output memristor from changing its resistance condition (resulting in a "0" in binary code). The state of an output memristor may be copied to a downstream memristor in another gate. The resistance state may ultimately be read with an independent read circuit that applies electrical current to the output memristor, and a current sensor attached to the read circuit may determine the resistance state of the output memristor.

FIG. 3 is a diagram of an illustrative chart (300) for a CLEAR operation. The purpose of the CLEAR operation is to write the output memristor to a known state that is independent of the state of the input memristors. In the examples below, the output memristor is written to an off state (high resistance state). In the examples of FIGS. 3-14, a logic operation includes two phases: (1) an unconditional write (the CLEAR operation in this case) and (2) a conditional write. This CLEAR operation is completed before the conditional write operation begins. The chart (300) schematically represents voltage drops across input memristors and the output memristor for input vectors of various weights. The chart in the example of FIG. 3 schematically represents the values of the inputs that may be applied to the circuitry to switch the output memristor off or to a CLEAR state.

In this example, the y-axis schematically represents a voltage drop across a memristor and the x-axis (304) schematically represents the weights of the input vector (the set of input memristors). The weight of a binary vector is the number of ones it contains. Further, a legend (306) indicates the values for the input voltages ($V_{in}$), the bias voltage ($V_b$), the output voltage ($V_{out}$), and the bias resistance ($R_b$).

In the example of FIG. 3, the input voltages are floated (using a 1 MΩ series resistor) so that they have a minimal affect on the output memristor. Such a condition will cause the input memristors to have essentially no effect on the output voltage. The voltage across the input memristor is represented in chart (300) with line (316). In the example of FIG. 3, floating the input voltages does not cause the voltage drop across the input memristor to cross either the on switch threshold or the off switch threshold. As a consequence, the input memristors remain in their existing resistance state.

In FIG. 3, while the input memristors provide minimal influence to the logic gate while they are floated, a bias voltage and an output voltage may be applied to the output memristor to turn the output memristor off. In this example, a positive output voltage Vout of 1.00 volt and a negative bias voltage Vb of –0.5 volts is applied. Such voltages cause the output memristor to experience a –1.4 voltage, which is schematically represented with line (318) and is below the off switch threshold (320). Thus, the operation turns the output memristor off. This CLEAR operation is an unconditional write operation, and therefore there is no dependence of the voltages plotted in FIG. 3 on the weight of the input vector. Thus, the plotted voltages are straight lines, with zero slope.

FIG. 4 is a diagram of an illustrative weight table (400), according to principles described herein. In this example, the weight table schematically depicts the same information as in the chart (300) of FIG. 3. In the illustrated example, the logic function (402) being performed is a clear function. Further, in this example, if both of the input memristors are in the off state, the output memristor will be written to the off resistance state. This may be schematically represented an input vector of 00 producing an output of 0. Thus, under these conditions an input weight of 0 (404) results in a "write 0" action (406).

Further, if exactly one of the input memristors has an on resistance state under these conditions, then the input weight is a 1 (408). However, under such conditions, an input weight of 1 still results in an action of "write 0" (406). Also, even if both of the input memristors have on resistance states, which is an input weight of 2 (410), the action is still a "write 0" action (406). Thus, the table of FIG. 4 covers all possible weights of the input vector (0, 1, or 2) for a 2-input logic circuit and gives the corresponding action in each case. A weight table representation works just for commutative logic functions. It does not work for noncommutative logic functions because noncommutative functions do not follow the rule that all input vectors with the same weight produce the same output.

Figure 5:
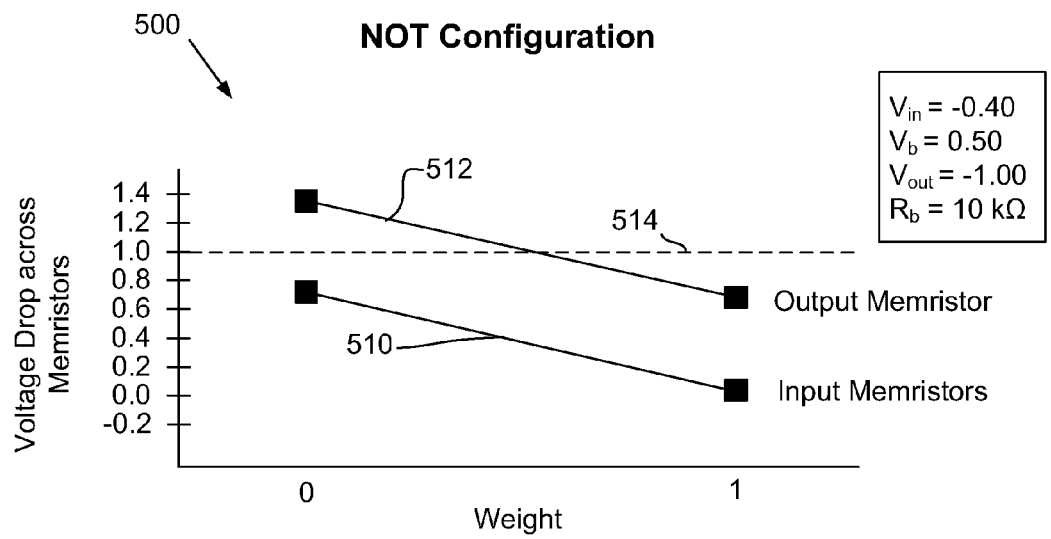
FIG. 5 is a diagram of an illustrative chart for a NOT operation schematically representing voltage drops versus weights, according to one example of principles described herein.

FIG. 5 is a diagram of an illustrative chart (500) schematically representing voltage drops across input and output memristors, for input vectors of various weights, according to principles described herein. The chart (500) in FIG. 5 schematically represents a logic NOT function that may be applied to the logic cell with memristors after the clearing phase has been performed. Thus, the inputs and outputs schematically depicted in FIGS. 5 and 6 are part of a second phase of performing the NOT function.

In the illustrated example, the logic cell has a single input memristor. The input voltage ($V_{in}$) is set at –0.40 volts, the bias voltage ($V_b$) is set at 0.50 volts, the output voltage ($V_{out}$) is set at –1.00 volts, and the bias resistance ($R_b$) is set at 10 kΩ. Under such conditions, if the single input memristor is off, the voltage drop across the input memristor ($V_c$-$V_{in}$), which schematically represented with the left most point of line (510), is approximately 0.70 volts. The input memristor being off will put a voltage of 1.3 volts across the output memristor, which is schematically represented with the left most point of line (512) and thus puts the voltage across the output memristor, above the on switch threshold (514). Thus, an input weight of 0 will cause the output memristor to switch on. In this example, if the input memristor is on, then the voltage across the output memristor is approximately 0.70 volts (right most point of line (512)), which will not push the voltage drop $V_c$-$V_{out}$ past the on switch threshold (514). Thus, an input weight of 1 will inhibit the output memristor from switching on. For both possible weights (0 and 1), the voltage across the input memristor (510) is below the switching threshold (514). Therefore, the input memristor does not switch during this operation.

Figure 6:
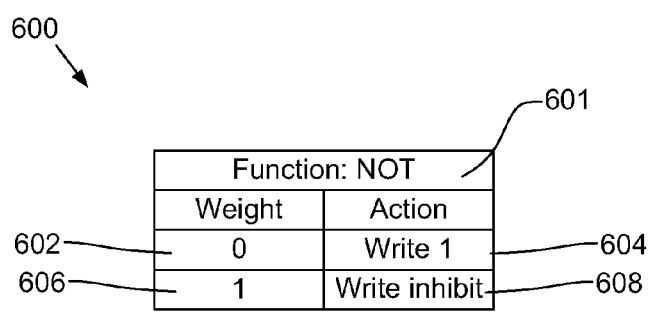
FIG. 6 is a diagram of an illustrative weight table for the NOT operation, according to principles described herein.

FIG. 6 is a diagram of an illustrative weight table (600) that corresponds to the information in FIG. 5, according to principles described herein. In this example, the logic function (601) is a NOT function. An input weight of 0 (602) will result in a "write 1" action (604), while an input weight of 1 (606) will result in a "write inhibit" action (608).

Figure 7:
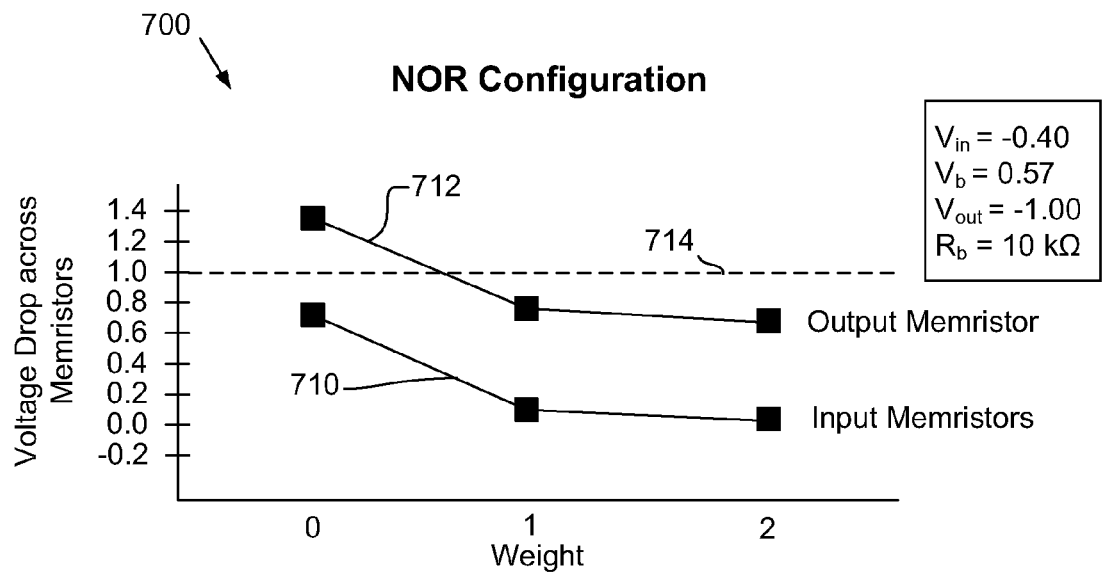
FIG. 7 is a diagram of an illustrative chart for a NOR operation schematically representing voltage drops versus weights, according to one example of principles described herein.
Figure 8:
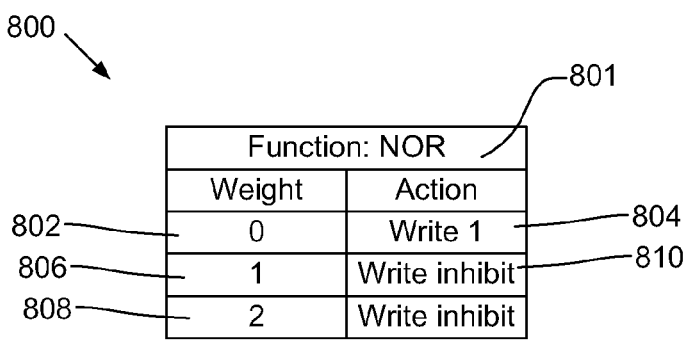
FIG. 8 is a diagram of an illustrative weight table for the NOR operation, according to one example of principles described herein.

FIG. 7 is a diagram of an illustrative chart (700) schematically representing voltage drops across input and output memristors for input vectors of various weights, according to principles described herein. The chart (700) in FIG. 7 schematically represents a logic NOR function that may be applied to the logic cell with memristors after the clearing phase has been performed. Thus, the inputs and outputs schematically depicted in FIGS. 7 and 8 are part of a second phase of performing the NOR function.

In the illustrated example, the logic cell has a two input memristors. The input voltage ($V_{in}$) is set at –0.40 volts, the bias voltage ($V_b$) is set at 0.57 volts, the output voltage ($V_{out}$) is set at –1.00 volt, and the bias resistance ($R_b$) is set at 10 kΩ. In such an example, the voltage across the output memristor $V_c$-$V_{out}$, which is schematically represented with line (712), is pushed above the on switch threshold (714) to 1.3 volts. Thus, an input weight of 0 will cause the output memristor to switch on. If just one or both of the input memristors are on, then the voltage across the output memristor is approximately 0.70 volts. Such a condition will not push the voltage across the output memristor $V_c$-$V_{out}$ past the on switch threshold (714). Thus, an input weight of 1 or 2 will inhibit the output memristor from switching on. The voltage drop across the input memristor $V_c$-$V_{in}$, schematically represented with line (710), is approximately 0.70 volts or less, for all input weights, and therefore the input memristors do not change their resistance state FIG. 8 is a diagram of an illustrative weight table (800) that corresponds to the information in FIG. 7, according to principles described herein. In this example, the logic function (801) is a NOR function. An input weight of 0 (802) will result in a "write 1" action (804), while an input weight of 1 (806) or an input weight of 2 (808) will result in a "write inhibit" action (810). Therefore, the input vector 00 will produce and output of 1, and the input vectors 01, 10, and 11 will produce an output of 0. Thus this circuit computes the NOR function.

Figure 9:
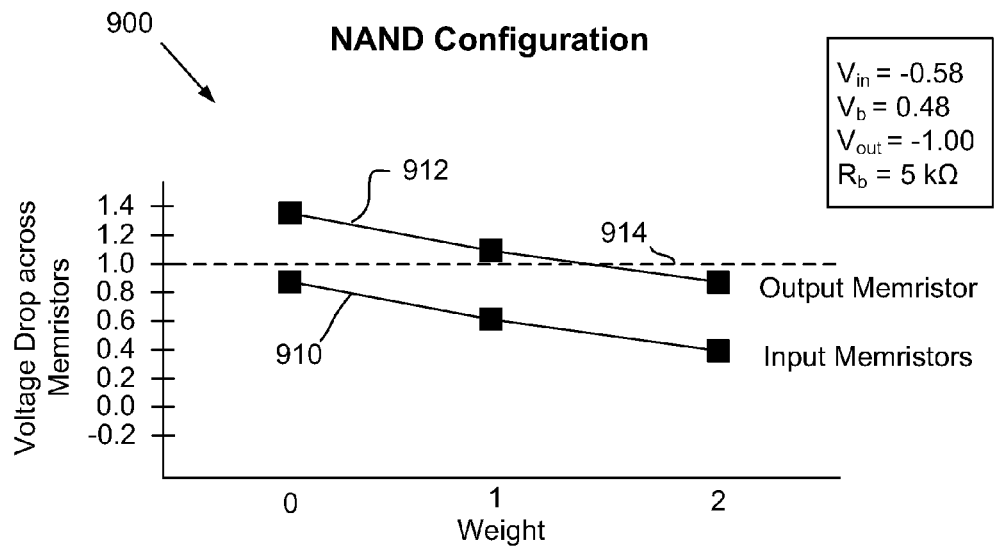
FIG. 9 is a diagram of an illustrative chart for a NAND operation schematically representing voltage drops versus weights, according to one example of principles described herein.

FIG. 9 is a diagram of an illustrative chart (900) schematically representing voltage drops across input and output memristors for input vectors of various weights, according to principles described herein. The chart (900) in FIG. 9 schematically represents a logic NAND function that may be applied to the logic cell with memristors after the clearing phase has been performed. Thus, the inputs and outputs schematically depicted in FIGS. 9 and 10 are part of a second phase of performing the NAND function.

In the illustrated example, the logic cell has a two input memristors. The input voltage ($V_{in}$) is set at −0.58 volts, the bias voltage ($V_b$) is set at 0.48 volts, the output voltage ($V_{out}$) is set at −1.00 volt, and the bias resistance (908) is set at 5 kΩ. Under such conditions, the voltage drop across the input memristor $V_c$-$V_{in}$, schematically represented with line (910), is approximately 0.90 volts or less, for all possible weights, and therefore the input memristors will not change state. In such an example, if both of the input memristors are off, the voltage drop across the output memristor $V_c$-$V_{out}$, which is schematically represented with line (912), is pushed above the on switch threshold (914). Thus, an input weight of 0 will cause the output memristor to switch on. If just one of the input memristors is on, the voltage across the output memristor $V_c$-$V_{out}$ will also be pushed above the on switch threshold. Thus, under these circumstances, an input weight of 1 will result in the output memristor turning on. However, if both of the input memristors are on, then the input voltage will not be sufficient to push the voltage across the output memristor $V_c$-$V_{out}$ past the on switch threshold (914). Thus, an input weight of 2 will inhibit the output memristor from switching on.

Figure 10:
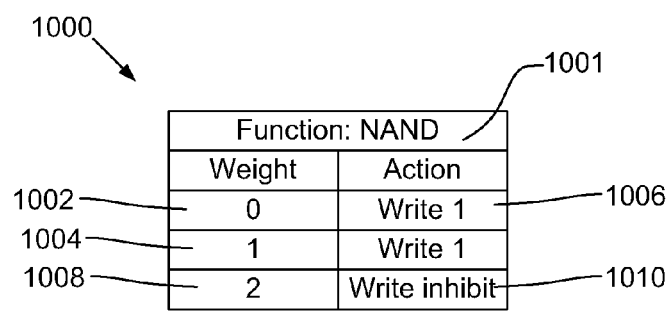
FIG. 10 is a diagram of an illustrative weight table for the NAND operation, according to one example of principles described herein.

FIG. 10 is a diagram of an illustrative weight table (1000) that corresponds to the information in FIG. 9, according to principles described herein. In this example, the logic function (1001) is a NAND function. An input weight of 0 (1002) or an input weight of 1 (1004) will result in a "write 1" action (1006), while an input weight of 2 (1008) will result in a "write inhibit" action (1010). Therefore, the input vectors 00, 01, and 10 will produce and output of 1, and the input vector 11 will produce an output of 0. Thus, this circuit computes the NAND function.

Figure 11:
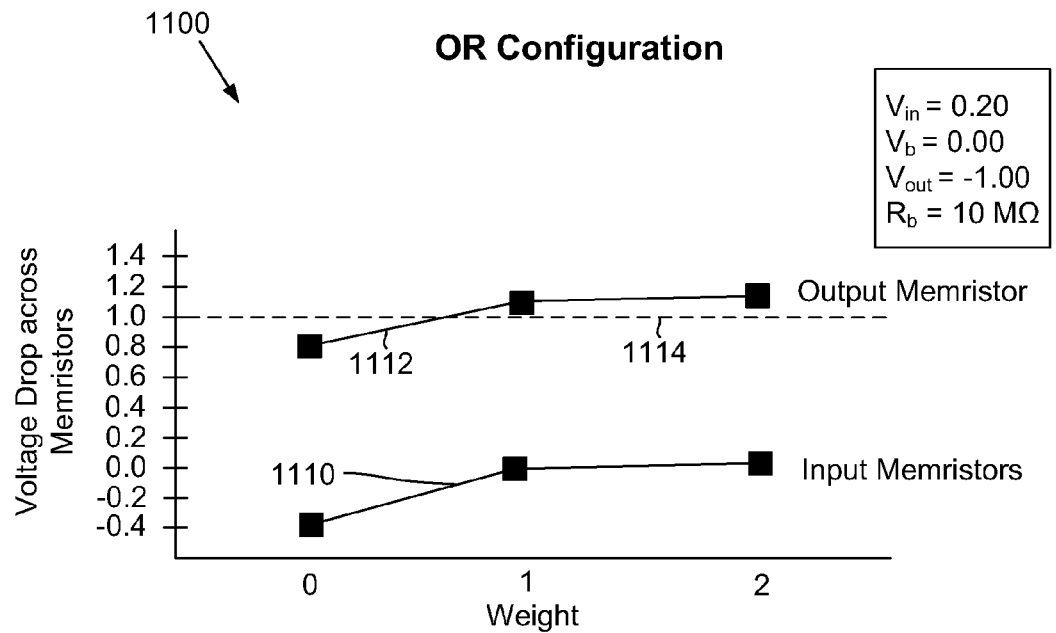
FIG. 11 is a diagram of an illustrative chart for a OR operation schematically representing voltage drops versus weights, according to one example of principles described herein.

FIG. 11 is a diagram of an illustrative chart (1100) schematically representing voltage drops across input and output memristors for input vectors of various weights, according to principles described herein. The chart (1100) in FIG. 11 schematically represents a logic OR function that may be applied to the logic cell with memristors after the clearing phase has been performed. Thus, the inputs and outputs schematically depicted in FIGS. 11 and 12 are part of a second phase of performing the OR function.

In the illustrated example, the logic cell has a two input memristors. The input voltage ($V_{in}$) is set at 0.20 volts, the bias voltage ($V_b$) is set at 0.00 volts, the output voltage ($V_{out}$) is set at −1.00 volt, and the bias resistance ($R_b$) is set at 10 MΩ. Under such conditions, if both of the input memristors are off, the voltage drop across the output memristor $V_c$-$V_{out}$, which is schematically represented with line (1112), is not pushed above the on switch threshold (1114). Thus, an input weight of 0 will inhibit the output memristor from switching on. However, if just one or both of the input memristors are on, the voltage across the output memristor $V_c$-$V_{out}$ will be pushed above the on switch threshold. Thus, under these circumstances, an input weight of 1 or 2 will result in the output memristor turning on. For all input weights, the voltage drop across the input memristor $V_c$-$V_{in}$, schematically represented with line (1110), is approximately 0.80 volts or less, and the input memristors do not change state.

Figure 12:
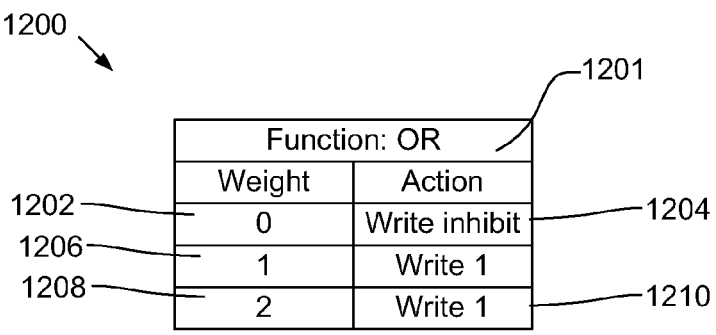
FIG. 12 is a diagram of an illustrative weight table for the OR operation, according to one example of principles described herein.

FIG. 12 is a diagram of an illustrative weight table (1200) that corresponds to the information in FIG. 11, according to principles described herein. In this example, the logic function (1201) is an OR function. An input weight of 0 (1202) will result in a "write inhibit" action (1204), while an input weight of 1 (1206) or an input weight of 2 (1208) will result in a "write 1" action (1210). Therefore, the input vector 00 will produce and output of 0, and the input vectors 01, 10, and 11 will produce an output of 1. Thus, this circuit computes the OR function.

Figure 13:
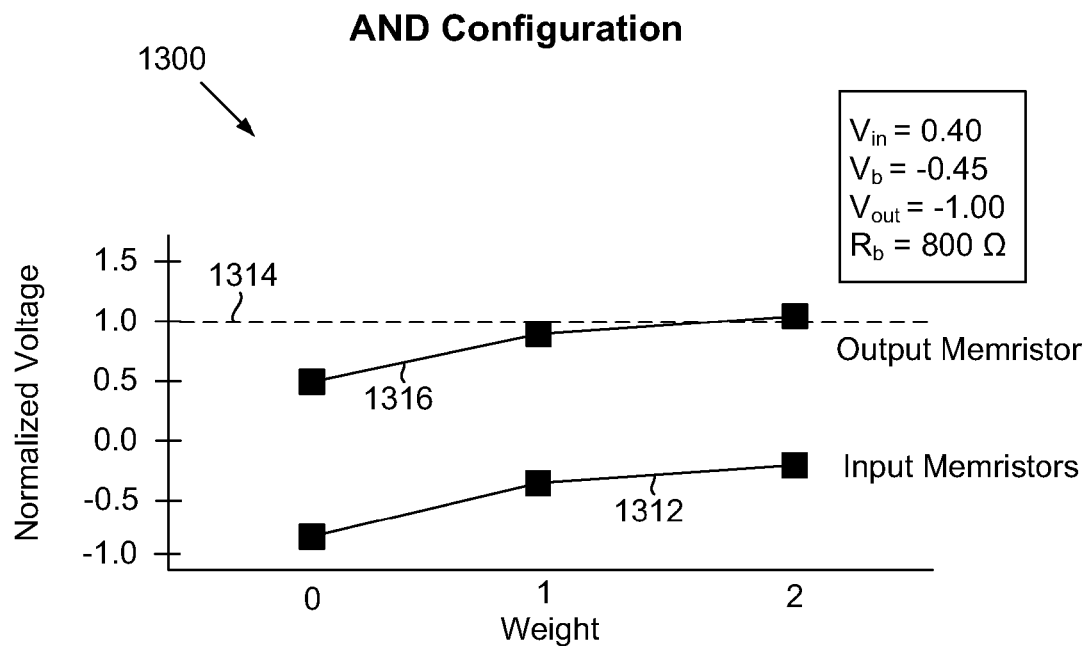
FIG. 13 is a diagram of an illustrative chart for a AND operation schematically representing voltage drops versus weights, according to one example of principles described herein.

FIG. 13 is a diagram of an illustrative chart (1300) schematically representing voltage drops across input and output memristors for input vectors of various weights, according to principles described herein. The chart (1300) in FIG. 13 schematically represents a logic AND function that may be applied to the logic cell with memristors after the clearing phase has been performed. Thus, the inputs and outputs schematically depicted in FIGS. 13 and 14 are part of a second phase of performing the AND function.

In the illustrated example, logic cell has a two input memristors. The input voltage (1302) is set at 0.40 volts, the bias voltage (1304) is set at −0.45 volts, the output voltage (1306) is set at −1.00 volt, and the bias resistance (1308) is set at 800 Ω. Under such conditions, if both of the input memristors are off or just one of the input memristors is off, the voltage drop across the output memristor $V_c$-$V_{out}$, schematically represented with line (1316), will not be pushed above the on switch threshold (1314). Thus, an input weight of 0 or an input weight of 1 will inhibit the output memristor from switching on. However, if both of the input memristors are on, the voltage drop across the output memristor $V_c$-$V_{out}$ will be pushed above the on switch threshold. Thus, under these circumstances, an input weight of 2 will result in the output memristor turning on. The input memristors do not change state.

Figure 14:
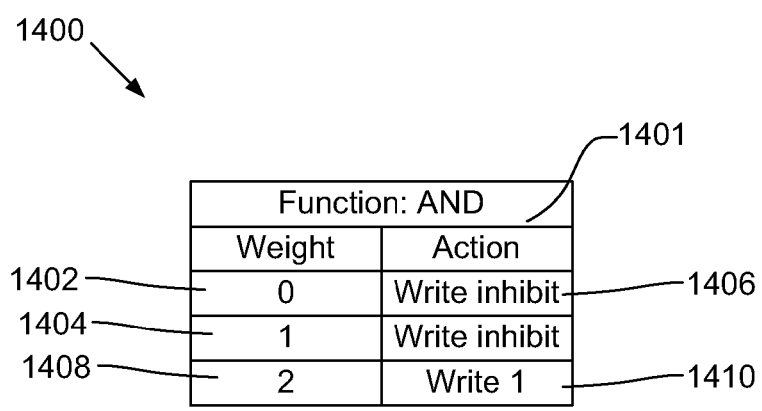
FIG. 14 is a diagram of an illustrative weight table for the AND operation, according to one example of principles described herein.

FIG. 14 is a diagram of an illustrative weight table (1400) that corresponds to the information in FIG. 13, according to principles described herein. In this example, the logic function (1401) is an AND function. An input weight of 0 (1402) and an input weight of 1 (1404) will result in "write inhibit" actions (1406), while an input weight of 2 (1408) will result in a "write 1" action (1410). Therefore, the input vectors 00, 01, and 10 will produce an output of 0, and the input vector 11 will produce an output of 1. Thus, this circuit computes the AND function.

Figure 15:
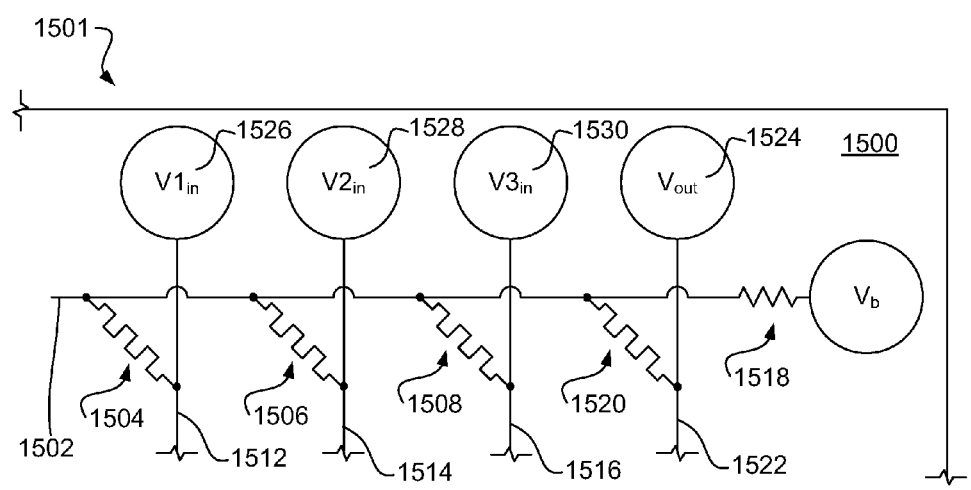
FIG. 15 is a diagram of an illustrative device with circuitry implementing a 3-input, 1-output logic gate in a crossbar, according to one example of principles described herein.

FIG. 15 is a diagram of an illustrative device (1500) with circuitry (1501) implementing logic, according to principles described herein. In this example, the device (1500) arranges the logic cell as a cross bar arrangement with at least one row (1502) and multiple columns. Each of the input memristors (1504, 1506, 1508) are electrically connected to the row (1502) and columns (1512, 1514, 1516) respectively. The bias resistor (1518) is electrically connected to the row (1510). The output memristor (1520) is electrically connected to the row (1502) and column (1522). Column (1522) electrically connects an output voltage source (1524) to output memristor (1520). Further, each of the input memristors (1504, 1506, 1508) are connected to input voltage sources (1526, 1528, 1530). The circuit of FIG. 15 may be topologically equivalent to the circuit of FIG. 2, but is drawn to indicate how the circuit naturally maps onto the geometry of a crossbar. The resistance of the wire (1502) is typically much lower than the on- or off-resistance of the memristors or resistors employed, so that the wire (1502) can be considered a single circuit node, equivalent to the central node Vc (103) of FIG. 1 or the central node of FIG. 2. In some examples, this arrangement of logic elements functions as a logic cell according to the principles described above.

The circuitry (1501) may be incorporated into any device that uses logic. A non-exhaustive list of devices that may be compatible with the principles described herein includes field programmable gate arrays, computers, laptops, electronic tablets, decoders, encoders, printers, copiers, phones, watches, mobile devices, instrumentation, automobiles, multiplexers, electronic machinery, tools, navigation systems, satellites, processing devices, controllers, other devices that use logic, or combinations thereof. Initial test results of the examples of the circuitry of FIGS. 2 and 15 indicate that the circuitry performs as intended.

Figure 16:
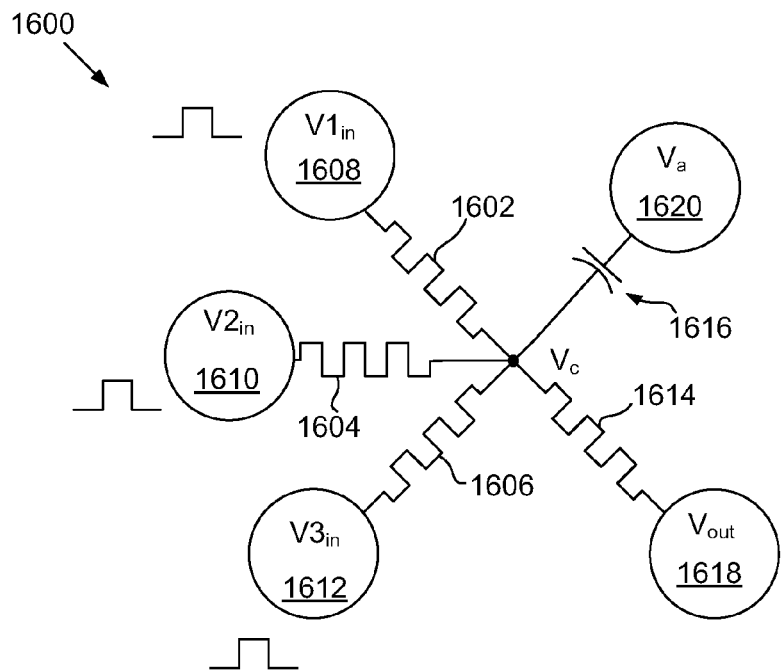
FIG. 16 is a diagram of illustrative circuitry for implementing a 3-input, 1-output logic gate which employs a summing capacitor, according to one example of principles described herein.

FIG. 16 is a diagram of illustrative circuitry (1600) for implementing logic, according to principles described herein. In this example, the circuitry (1600) has a first input memristor (1602), a second input memristor (1604), and a third input memristor (1606), which are connected to a first input voltage source (1608), a second input voltage source (1610), and a third input voltage source (1612). In this example, each of the input memristors (1602, 1604, 1606) are electrically connected to an output memristor (1614) and a capacitor (1616). The output memristor (1614) is also connected to an output source (1618), and the capacitor (1616) is electrically connected to another voltage source (1620).

The input voltage sources (1608, 1610, 1612) may be variable voltage sources that may be used to provide voltage pulses. In this example, each of the input voltage sources (1608, 1610, 1612) may apply different voltage values. For example, the voltage from the first input voltage source (1608) may be greater or less than the voltage applied with the second input voltage source (1610). Further, the voltage levels from each of the input voltage sources (1608, 1610, 1612) may vary at different times. Further, the impedance of each of the input voltage sources (1608, 1610, 1612) may also vary. Thus, the voltage inputs applied to each of the input memristors (1602, 1604, 1606) may be different for each phase of a logic operation.

The input memristors may have an on resistance state where the resistance of the memristor is low, and thereby allow a current pulse from the respective input voltage source to pass through to the summing capacitor (1616). An input memristor may be switched to the on resistance state by applying a positive voltage above an on switch threshold. Similarly, the memristor may also have an off resistance state where the resistance of the memristor is high, and thereby blocks a current pulse from passing through the input memristor. A memristor may be switched to the off resistance state when a negative voltage is applied across the input memristor that is below an off switch threshold. Voltages applied to the input memristors between the on switch threshold and the off switch threshold may not affect the input memristor's resistance state.

In some examples, current pulses from some of the input voltage sources (1608, 1610, 1612) may pass through the input memristors (1602, 1604, 1606) while other signals are prevented from passing through due to the resistance state of each of the memristors. Memristors which are on allow the current pulses to pass through, whereas memristors that are off block the pulses. The charges of those current pulses that are permitted to pass through may be summed by the capacitor (1616). The voltage pulses driving the input memristors may have a fixed voltage and duration. The magnitude of the resulting current pulse will depend on the on/off state of each input memristor. The total charge delivered to the capacitor will be approximately proportional to the number of the on memristors, and so to the weight of the input vector. Therefore the voltage on the capacitor will also be approximately proportional to the weight of the input vector. The capacitor acts as an accumulator as it sums the charge in the current pulses; and by the Q=CV nature of a capacitor, it also produces a voltage representation of this sum, namely, the voltage across the capacitor. By choosing the voltage and pulse duration of the driving voltage pluses, it can be arranged that some input vector weights trigger write operations, while other weights do not. Thus, this circuit implements a conditional write. If the overall voltage drop that reaches the output memristor (1614) is higher than the on switch threshold, then the output memristor (1614) is switched on.

During an initial clearing phase of the illustrated example, the output voltage may apply a negative voltage to the output memristor (1614) with sufficient strength to cause the output memristor (1614) to switch to an off resistance state. Prior to the conditional write in each logic cycle, the capacitor is discharged to ground (or some predetermined voltage) before the summing operation, in order to reset the capacitive accumulator to zero. In a second phase of a logic function, the input control voltage sources (1608, 1610, 1612) may apply their inputs voltages to determine whether the resistance state of the output memristor (1614) is switched on or whether the output memristor's resistance state is inhibited from switching on. Thus, the circuit of FIG. 16 can perform conditional-write operations and unconditional-write operations similar to the examples of FIGS. 3-14. Although FIG. 16 shows a circuit with three inputs, this scheme works for any number of inputs (one or more) to the circuit. Thus, with this family of capacitive-sum memristor-based logic gates, it is possible to implement logic gates for the one-input functions NOT and COPY, the k-input logic functions NOR, NAND, AND, OR, XOR, and m-of-k threshold gates (which includes MAJ gates), for arbitrary k. From the primitive logic gates just mentioned, any arbitrary logic function can be synthesized.

Figure 17:
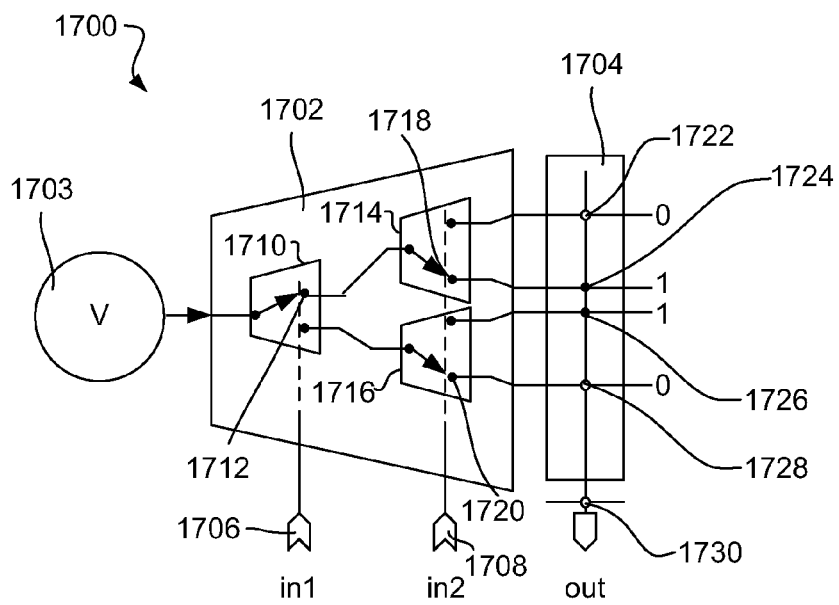
FIG. 17 is a conceptual diagram of illustrative circuitry for implementing a 2-input, 1-output logic gate which employs a memristor-implemented multiplexer and lookup table, according to one example of principles described herein.

FIG. 17 is a diagram of illustrative circuitry (1700) for implementing logic, according to principles described herein. In this example, memristors are incorporated into a demultiplexer (1702) and are positioned to dynamically route a signal from a voltage source (1703) through the demultiplexer (1702) to specific locations within a look-up table (1704). Memristors in the demultiplexer may be turned on or off to guide the signal through a path of the least electrical resistance. At least one memristor, such as memristors connected to input circuitry 1706 and 1708, form the input vector, which acts as an address to the demultiplexer circuit. The address determines the location in the look-up table to which the voltage source is routed. This is the selected location. The resistance state of the memristor at the selected location is copied to the output memristor.

The memristors in the multiplexer (1702) may be controlled with multiple inputs that select which memristors to switch on (causing the memristor to have a low resistance) to provide a path of least resistance for the signal. In the illustrated example, the circuitry (1700) has a first input (1706) and a second input (1708). For example, the first input may cause one of two memristor at a first pathway junction (1710) to switch on. Thus, the signal may pass through the switched on memristor (1712) at the first pathway junction (1710). The second input may cause two memristors to switch on, a single memristor in each of a second pathway junction (1714) and a third pathway junction (1716). In this example, the pathway junctions take the form of a 2-to-1 bidirectional analog multiplexer (BAMux) circuit.

In the illustrated example, the first pathway junction (1710) routed the signal to the second pathway junction (1714), while preventing the signal from traveling to the third pathway junction. Thus, the memristor (1718) at the second pathway junction (1714) will contribute to routing the signal to a specific position within the look-up table (1704). The switching on of the memristor (1720) at the third pathway junction (1716) does not contribute to the routing of the signal in this example. However, the third pathway junction (1716) would have contributed to routing the signal had the first pathway junction routed the signal to the third pathway junction (1716).

In the example of FIG. 17, the look-up table (1704) has four positions (1722, 1724, 1726, 1728) to which a signal may be routed. Each position (1722, 1724, 1726, 1728) in the look-up table (1704) may have a resistive circuit element with a resistance state that either allows a voltage signal to pass through the position (low resistance or "1") to an output memristor (1730) or inhibits a signal from passing through (high resistance or "0"). For example, these resistive circuit elements may be hard-wired circuit connections (which have been selectively connected in permanent fashion to form the ones and zeroes of a read-only memory), or they may be memristors (which have been programmed at an earlier time to define the contents of the lookup table). As a consequence, if a signal reaches the output memristor (1730), the signal may have a voltage sufficient to switch the output memristor (1730) on, which may be interpreted as a "1" in binary code. On the other hand, if the signal is blocked, then the signal may fail to switch the output memristor (1730) on leaving the output memristor (1730) in a high resistance state, which may be interpreted as a "0" in binary code. The output memristor was cleared in an initial step before this conditional write to the output memristor takes place. In the illustrated example, the circuit elements in the look-up table (1704) are memristors that are written to represent binary information where a "1" corresponds to a low resistance state and a "0" corresponds to a high resistance state. However, in other examples, the circuit elements in the look-up table (1704) may be resistors, latches, memory elements, circuit elements with bistable states, other circuit elements capable of storing memory, or combinations thereof. If the voltage at (1703) is chosen properly, the on or off state of the memristor in the look-up table's selected location (1724) is copied to the output memristor (1730).

The inputs (1706, 1708), the pathway junctions (1710, 1714, 1716), and the look-up table (1704) may be arranged in a cross bar array. A more detailed description of how an illustrated example of the circuitry may operate in a cross bar array is described in relation to FIG. 18 below.

Figures 18, 19:
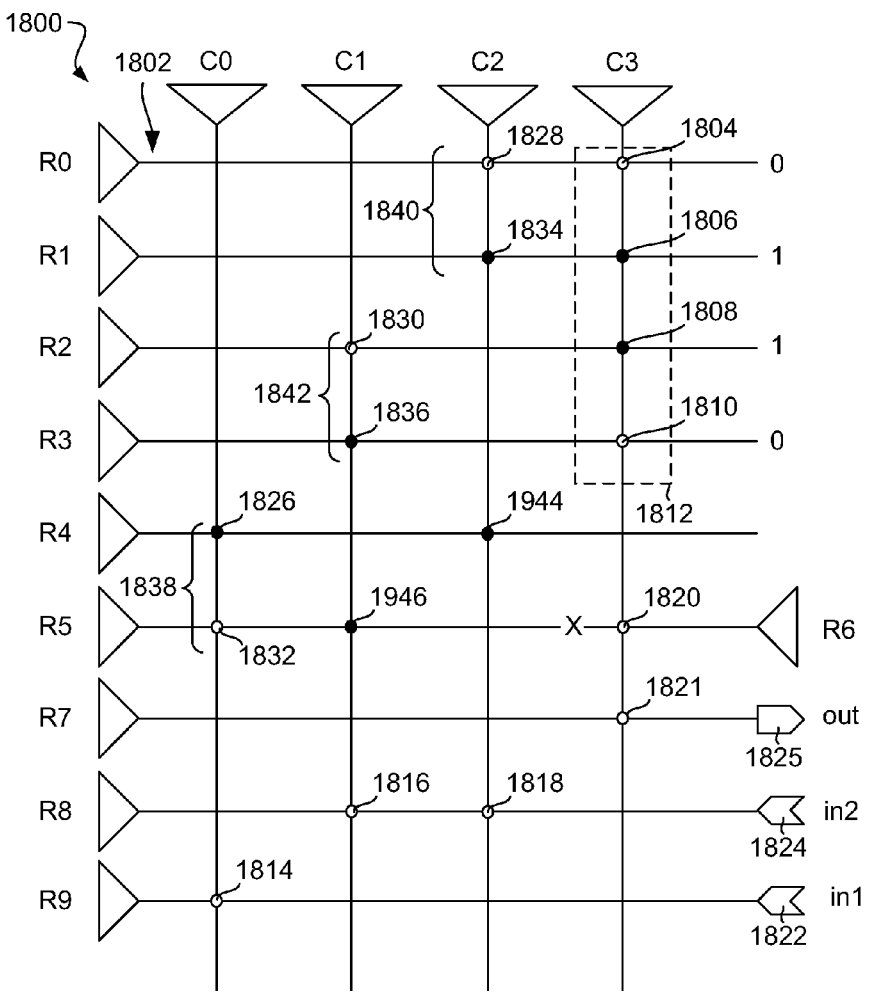
FIG. 18 is a diagram of illustrative circuitry in a crossbar for implementing a 2-input, 1-output logic gate which employs a memristor-implemented multiplexer and lookup table, according to one example of principles described herein.
FIG. 19 is a diagram of an illustrative method for the conditional-write operation, which is used in implementing logic, according to one example of principles described herein.

FIG. 18 is a diagram of illustrative circuitry (1800) for implementing logic, according to principles described herein. In this example, the circuitry (1800) is implemented in a cross bar array (1802) with rows R0-R9 and columns C0-C3. The look-up table (LUT) memristors (1804, 1806, 1808, 1810) of the LUT (1812) are at the intersection of column C3 with rows R0-R3. The first input memristor (1814) is found at the intersection of row R9 and column C0. The second inputs memristors (1816, 1818) are found at the intersection of row R8 and columns C1 and C2 and these two memristors are constrained to have the same state. Also, the cross bar wire of rows R5 and R6 is intentionally broken. An output memristor (1820) is located at the intersection of row R6 and column C3. Each of the voltage rows and columns are in electrical communication with voltage sources, such as clock drivers.

Multiplexer memristors are at some of the intersections of column C0-C2 and rows R0-R5. In the illustrated example, the intersections with memristors are denoted with a closed or open circle (a closed circle indicates that the memristor is on while an open circle indicates the memristor is off). In this example, those intersections without memristors (no circle) are not electrically connected. The placing of the memristors at the intersections may be performed during the manufacture of the cross bar array (1802). In some examples, the cross bar array (1802) is manufactured on an application specific integrated circuit (ASIC) chip.

In the example of FIG. 18, a logic operation may be performed in a sequence of eight phases. In other examples, the logic operation is performed in more or less phases. In some examples, the circuitry of the cross bar is arranged differently, and as a consequence, the number of phase and the sequence of phases may be different. Any cross bar arrangement, any number of phases, or any sequence of phases that are compatible with the principles described herein may be used.

The multiplexer memristors may be cleared during the first phase. The multiplexer memristors may be cleared by applying a negative voltage on columns C0-C2 and a positive voltage on rows R0-R5 such that the voltages drops across all memristors in this region are below the off switch threshold. As a consequence, all of the multiplexer memristors are set to have a high resistance.

During the second phase, the input isolation memristors (1814, 1816, 1818) and the output isolation memristor (1821) are turned on. These memristors may be switched on by applying a positive voltage to each of the respective columns and negative voltages to the respective rows such that the collective voltages exceed the on switch threshold. The first input isolation memristor (1814) is connected to a first input (1822), and the second input isolation memristors (1816, 1818) are connected to a second input (1824). The first and second inputs (1822, 1824) are connected to different logic gates which are not shown in FIG. 18. For purposes of this description, the circuitry of FIG. 18 will be referred to as gate A and the logic gate providing the inputs is referred to as gate B.

The third phase includes selectively switching on the multiplexer memristors for subsequent logic operations. In this phase, the voltage sources connected to columns C0-C2 may be floated such that the electrical resistances of these columns are raised high enough to effectively prevent electron flow to the columns from their voltage sources. While columns C0-C2 are floated, a copy-with-inversion (also called NOT) operation is used to copy the output memristor in an external circuit at the memristor located at R5, C0. In a later phase, a second copy-with-inversion makes the memristor located at R4, C0 the complement of the memristor located at R5, C0. Now, the memristor located at R4, C0 has the same resistance state as the external output memristor. Thus, the output state of the gate B has been propagated to act as input to a gate A. The copy-with-inversion operation links the two different gates A and B. In gate A, voltage source R6 drives through the output memristor (1820), and then through the output isolation resistor (1821) to reach the interconnect output node (1825). Dedicated writing links the output terminal (1825) of the gate A to the input terminal (1822) of gate B. In gate B, the signal from the input terminal (1822), through the input isolation memristor (1814) to reach the target of this operation, which is memristor (1832). The circuit path stretches from the voltage source located at R6 and its adjacent output memristors (1820) in gate A, through some routing memristors and hardwired wiring paths to reach memristor (1832) in gate B. This copy-with-inversion is the same as the NOT circuit described in FIGS. 3-6. In this example, row R4 applies the appropriate voltage to switch on the memristor (1826) at the intersection of column C0 and row R4 is switched on.

Also, a voltage may be applied to the second input (1824), which is connected to both second inputs isolation memristors (1816, 1818) connecting the second input to columns C1 and C2. The respective rows of the selected multiplexer memristors also apply the appropriate voltage. In this example, a similar process as described above operates to switch on the memristor (1828) at the intersection of row R0 and column C2 and memristor (1830) at the intersection of row R2 and column C1.

The isolation memristors (1814, 1816, 1818, 1821) are switched off during the fourth phase. During this phase, columns C0-C2 and rows R8-R9 apply voltages which cause the resistance state of each of the input memristors (1814, 1816, 1818) to have a high resistance. The logic cell of FIG. 18 is effectively disconnected from the other logic cells that are connected to first and second input (1822, 1824) when the input memristors (1814, 1816, 1818, 1821) are switched off.

In the fifth phase, the memristor pairs may be built by performing the second of two successive copy with inversion operations. In each of the pathway junction pairs (1838, 1842, 1840), the lower memristor is copied-with-inversion to the upper memristor. Therefore, each pair of memristors is a complementary pair, where one of the memristors will be on while the other is off. In some examples, if one of the memristors of the pair switches to an on resistance state, then the other memristor in the pair will automatically switch to an off resistance state.

The sixth phase involves electrically connecting a first switch (1838) to the remaining two switches (1840, 1842). In the first switch, either memristor (1826) or memristor (1832) will be on while the other is off. Thus, each of the memristors (1826, 1832) of the first switch (1838) needs to connect to the remaining switches. In this example, memristor (1844) is switched on to electrically connect memristor (1826) of the first pair to the second switch (1840). Also, memristor (1846) is switched on to electrically connect and memristor (1832) of the first switch (1838) to the third switch (1842).

The output memristor (1820) is cleared during the seventh phase. This may be accomplished by applying the appropriate voltages with column C3 and row R6.

The last phase includes looking up the information in the LUT (1812). In this phase, columns C1-C2 and rows R0-R5 are floated. A voltage is driven down column C0, which follows the low resistance path of switched on memristors that was established during the previous seven phases.

The selected LUT memristor will either be on or off depending on the type of binary information written to that memristor/resistive element. In the event, that the selected LUT memristor is off (has a high electrical resistance), a signal with a low voltage will reach the output memristor (1820). On the other hand, if the selected LUT memristor is on, the signal will not be inhibited so a signal with a high voltage will reach the output memristor. Depending on the polarity of the signal and the signal's strength, the signal may cause the output memristor (1820) to turn on or the signal may inhibit the output memristor (1820) from turning on. Thus, the selected LUT memristor's state is copied to the output memristor.

The phases described above may be repeated multiple times. In some examples, the memristors that are switched on may vary during the repeated cycles depending on the information provided by the inputs. However, the LUT memristors will typically remain consistent, unless the new information is written into the LUT (1812). In some examples, the principles described in FIGS. 17 and 18 are applied to field programmable gate arrays. In other examples, these principles are applied to hard wired electrical connections in a dedicated circuit. In some examples, this arrangement of memristor implemented logic is used to compute any 2-in, 1-out logic function. In some examples, the four LUT memristors may be used to compute all possible 2-in logic functions. In some examples, this general scheme is used to make logic gates with three or more inputs. In some examples, this general scheme is used to make logic gates with one input. In some examples, the scheme is extended to two or more outputs by adding more columns to the LUT and more output memristors. In general, a demulplexer-LUT logic gate circuit with K inputs and J outputs may include a LUT with $2^J$ rows and K columns.

FIG. 19 is a diagram of an illustrative method (1900) for implementing logic, according to principles described herein. In this example, the method (1900) includes setting (1902) a first set of resistance states of one or more bistable input memristors, where the one or more bistable input memristors are in electrical communication with a bistable output memristor that has a second resistance state. A voltage is applied (1904) to the bistable output memristor through the one or more bistable input memristors such that the first set of resistance states of the one or more bistable input memristors influence whether the bistable output memristor switches the second resistance state.

In some examples, the method (1900) further includes applying a second voltage to the bistable output memristor through a second bistable input memristor where the second bistable input memristor has a third resistance state and the third resistance state contributes to influencing whether the bistable output memristor switches the second resistance state. In some examples, the bistable input memristor is positioned to dynamically route a signal to a destination. In other examples, a second voltage is applied to the output memristor through a bias resistor, and a resistance of the bias resistor contributes to whether the bistable output memristor switches the second resistance state. In some examples, the method further includes summing the charge current pulses induced by voltage pulses with the charges of a second voltage applied to the output memristor through a second input memristor with a capacitor.

Figure 20:
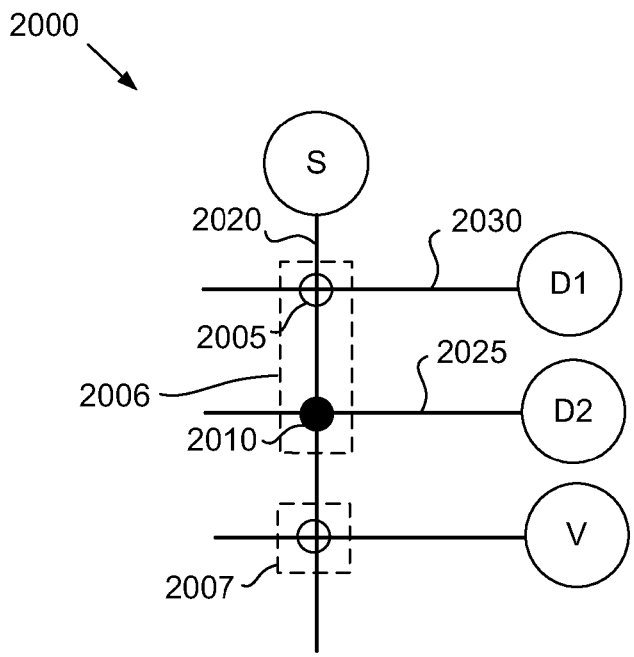
FIG. 20 is a diagram of one implementation of a 1-to-2 bidirectional analog multiplexer, according to one example of principles described herein.

FIG. 20 is a diagram of a memristor based bi-directional analog multiplexer (BAMux) (2000). The BAMux (2000) includes a set of routing memristors (2006). In this example, the set (2006) includes two bistable routing memristors (2005, 2010). The resistance states of the bistable routing memristors are determined by a set of control memristors (2007). The resistance states of the control memristors determine the state of each of the two bistable routing memristors (on or off states). The bistable routing memristors selectively connect a source wire (2020) to at least one of the two or more destination wires (2025, 2030). This connects the source S to one or more of the target locations (D1, D2). For example, in FIG. 20 the second bistable routing memristor is in a low resistance state (indicated by a solid black dot) and the first bistable routing memristor is a high resistance state (indicated by a hollow circle). This connects the source S to target location D2.

Figure 21:
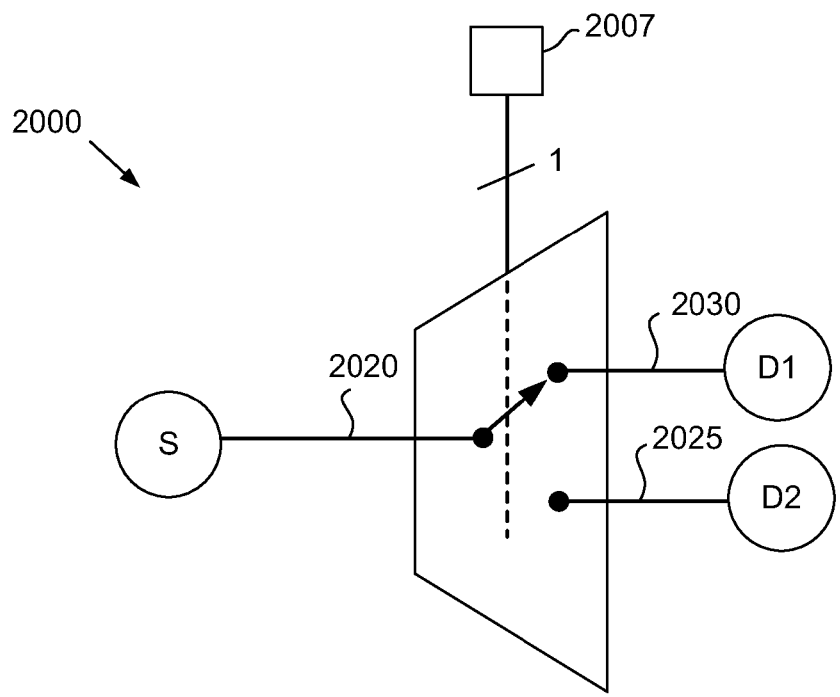
FIG. 21 is a schematic diagram of a 1-to-2 bidirectional analog multiplexer, according to one example of principles described herein.

FIG. 21 shows the BAMux (2000) as a schematic diagram, with the source S on the left and the target locations D1, D2 on the right. Since it is bidirectional, the BAMux (2000) can act as either a demultiplexer or a multiplexer. When the BAMux (2000) is operating as a multiplexer, the BAMux selects one of the destination wires (2025, 2030) and connects it to the source wire (2020). This implies that data or other signals are moving from right to left (from the destination nodes (D1, D2) to the source S). When the BAMux (2000) is acting as a demultiplexer, the BAMux selectively connects the source wire (2020) to one or more of the designation wires (2025, 2030). This implies that data or other signals are moving from the left to right (from the source S to the destination nodes (D1, D2)). Because the memristor based BAMux operates by changing memristor states in a crossbar array, the BAMux can operate equally well as a multiplexer and as a demultiplexer. The same BAMux circuit can be called an n-to-1 BAMux (when used as a multiplexer), or a 1-to-n BAMux (when used as a demultiplexer). In some examples, the multiple routing-target locations (nodes D1, D2) are locations within a memristor based look-up table, as described in FIG. 18. The resistance states of the set of at least two bistable routing memristors determine to which routing-target location a signal from the source is sent. For example, the one source wire and two or more destination wires may be wires within a crossbar array and the bistable routing memristors and control memristors may be crosspoint devices within the crossbar array. The memristor based look-up table may also comprise memristors within the crossbar array.

Figure 22:
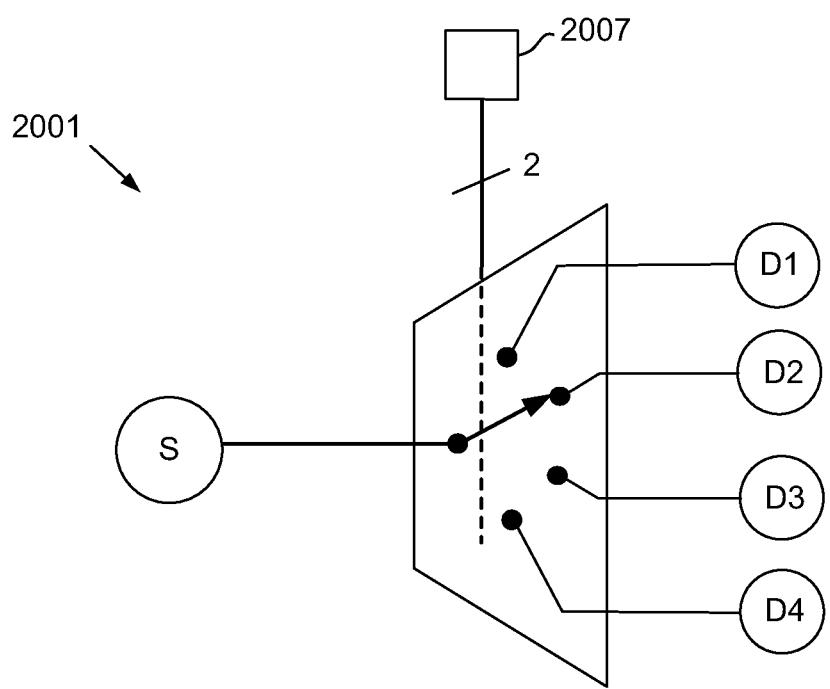
FIG. 22 is a diagram of a 1-to-4 bidirectional analog multiplexer, according to one example of principles described herein.

FIGS. 20 and 21 show a 2-to-1 BAmux circuit. FIG. 20 shows the memristor based implementation of this 2-to-1 BAmux (1710, 1714, 1716). FIG. 21 shows this circuit symbolized with a traditional trapezoid used for a mux subcircuit. FIG. 22 shows a symbolization of a 4-to-1 BAmux (2001). At least two control (or address) memristors (2007) are needed to select one destination from the four possible destinations (D1-D4). FIG. 17 shows how a 4-to-1 BAmux (1702) can be made from three 2-to-1 BAmux circuits (1710, 1714, 1716).

FIG. 18 shows how these three 2-to1 BAmux circuits and the 4-to-1 BAmux built from them can be implemented in a crossbar array of memristors. For example, the 2-to-1 BAmux 1710 corresponds to routing memristors 1838. The control memristor associated with routing memristors 1838 is an external memristor (the output memristor of another instance of the FIG. 18 circuit). We will call one instance of FIG. 18 "gate A", and the other instance of FIG. 18 "gate B". The output memristor 1820 of gate A is electrically connected through its output pin 1825, through a hardwired interconnect wiring path, through the input pin 1822 of gate B, to the routing memristors 1838 of gate B. The full electrical path linking routing memristors 1838 of gate B (1838B) and its control memristor 1820 of gate A (1820A) is 1820A, 1821A, 1825A, hardwired interconnect wiring, 1822B, 1814B, and 1838B.

While the examples above have been described with reference to specific arrangements, any arrangements may be used that are compatible with the principles described herein. Further, the examples above have been described above with reference to specific devices and uses, any devices and uses compatible with the principles described herein may be used. Also, while the examples above have been described with reference to specific logic functions, any logic function capable of being executed according to the principles described herein may be used. Further, while the examples above have been described with specific reference to particular materials and material characteristics, any materials and material characteristics compatible with the principles described herein may be used.

In some examples, the logic cells are implemented in cross bar arrays. In some examples, multiple logic cells are implemented in a single cross bar array layer. In some examples, multiple layers of cross bar arrays are stacked together. In some examples, logic cells from one of the cross bar layers is in communication with logic cells of other layers of the cross bar stack. In some examples, a hybrid architecture that has both CMOS technology and memristor implemented logic are incorporated into a single device. For example, the bottom layer of a stack may include CMOS circuits, while the upper layers of the stack have logic circuits that are built with memristors. Although memristors in the examples above are described as having two distinct states (on and off), memristors can be used as analog devices that are programmable to any number of states.

In some examples, the logic implemented with memristors is smaller than if that logic were implemented in CMOS. As a consequence, the memristor implemented logic may increase the local area logic density of devices that use logic. In some examples, lower operating voltages may be used in memristor logic than the voltage used in CMOS logic gates. As a consequence, the memristor implemented logic may reduce the energy usage per logic operation, and therefore, reduce power consumption of such gates, and of chips built with them.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A device for implementing logic with memristors, comprising:
    circuitry comprising at least three memristors and a bias resistor in a logic cell;
    one of said at least three memristors being an output memristor within said logic cell and other memristors of said at least three memristors are input memristors; and
    each of said at least three memristors and said bias resistor are electrically connected to voltage sources, wherein each voltage applied to each of said at least three memristors and said bias resistor and resistance states of said at least three memristors determine a resistance state of said output memristor.

2. The device of claim 1, wherein said logic cell implements any one of: a NAND gate, AND gate, NOR gate, OR gate, NOT gate, XOR gate, a MAJ gate, full adder, or combinations thereof.

3. The device of claim 1, wherein an voltage drop $V_c$-$V_{out}$ is applied to said output memristor substantially according to $V_c=(\Sigma(G_i)(V_i))/\Sigma G_i$, where $V_c$ is a voltage of a central node of the logic cell, $G_i$ is input conductances of said at least three memristors and said bias resistor, and $V_i$ is a voltage applied to said at least three memristors and said bias resistor.

4. The device of claim 1, wherein said circuitry is arranged in a cross bar array.

5. The device of claim 1, wherein said bias resistor and said voltages are adjustable from a first phase to a second phase.

6. The device of claim 1, said at least three memristors comprise at least one of: niobium, titanium, tungsten, manganese, iron, vanadium, indium, silicon, tantalum, hafnium, nickel, aluminum, zirconium, molybdenum, copper, chromium, silver, oxides thereof, nitrides thereof, carbides thereof, phosphides thereof, sulfides thereof, doped alloys thereof, single element metals, semiconductors, or combinations thereof.

7. The device of claim 1, wherein said bias resistor is another memristor.

8. A circuit for implementing logic with memristors, comprising:
   at least two memristors and a capacitor in a logic cell;
   one of said at least two memristors is an output memristor within said logic cell and remaining memristors of said at least two memristors are input memristors; and
   each of said at least two memristors and said capacitor are electrically connected to voltage sources, wherein each voltage applied to each of said at least two memristors and said capacitor determine a resistance state of said output memristor where said resistance state of said output memristor is a function of resistance states of said input memristors.

9. The device of claim 8, wherein said input memristors are connected in parallel to said capacitor, wherein said capacitor is positioned to sum charges of signals passed through said input memristors with a voltage across said capacitor representing said sum of charges used to determined resistance states of said output memristor.

10. The device of claim 8, wherein said voltage sources are time varying voltage sources that act as control signals.

11. The device of claim 8, wherein said logic cell implements any one of: a NAND gate, AND gate, NOR gate, OR gate, NOT gate, XOR gate, a MAJ gate, full adder, or combinations thereof.

12. A device with memristor implemented logic, comprising:
   circuitry comprising a memristor array arranged as a digital look-up table;
   a set of memristors acting as a demultiplexer arranged to route a signal to at least one selected memristor in a look-up table of said memristor array, in which said selected memristor is specified with a set of at least one input memristor acting as an address of said selected memristor within said look-up table; and
   at least one output memristor electrically connected to said memristor array;
   wherein a resistance state of said selected memristors is copied to said output memristors.

13. The device of claim 12, wherein said look-up table comprises dimensions of $(2^k)(j)$, where k represents a length of a binary bit input vector and j represents a length of a binary bit output vector.

14. The device of claim 12, wherein said memristor array, said set of memristors, and said output memristor are arranged in a cross bar array.

15. The device of claim 12, wherein at least two memristors in which said set of memristors form a bi-directional analog multiplexer.

16. A device with a memristor based bi-directional analog multiplexer, comprising:
   a set of at least two bistable routing memristors;
   a set of one or more control memristors comprising resistance states to determine that whether a state of each of the set of at least two bistable routing memristors is an on state or an off state; and
   one source wire and two or more destination wires, in which states of the control memristors determine which of the destination wires are electrically connected to the source wire.

17. The device of claim 16, wherein the bi-direction analog multiplexer comprises one of: a demultiplexer or a multiplexer.

18. The device of claim 16, wherein said set is positioned along a pathway between a voltage source connected to the source wire and multiple routing-target locations connected to the two or more destination wires.

19. The device of claim 18, wherein said multiple routing-target locations are locations within a look-up table, in which the one source wire and two or more destination wires are wires within a crossbar array and the bistable routing memristors and control memristors are crosspoint devices within the crossbar array.

20. The device of claim 18, wherein resistance states of said set of at least two bistable routing memristors determine to which routing-target location a signal from a voltage source connected to the source wire is sent.

* * * * *